United States Patent
Milano et al.

(10) Patent No.: US 10,333,055 B2
(45) Date of Patent: *Jun. 25, 2019

(54) METHODS FOR MAGNETIC SENSOR HAVING NON-CONDUCTIVE DIE PADDLE

(71) Applicant: Allegro MicroSystems, LLC, Worcester, MA (US)

(72) Inventors: Shaun D. Milano, Dunbarton, NH (US); Michael C. Doogue, Bedford, NH (US); William P. Taylor, Amherst, NH (US)

(73) Assignee: Allegro MicroSystems, LLC, Manchester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/447,320

(22) Filed: Mar. 2, 2017

(65) Prior Publication Data

US 2017/0179377 A1    Jun. 22, 2017

Related U.S. Application Data

(60) Continuation of application No. 15/049,732, filed on Feb. 22, 2016, now Pat. No. 9,620,705, which is a
(Continued)

(51) Int. Cl.
*G01R 33/00* (2006.01)
*G01R 33/07* (2006.01)
(Continued)

(52) U.S. Cl.
CPC .......... *H01L 43/04* (2013.01); *G01R 33/0029* (2013.01); *G01R 33/0076* (2013.01);
(Continued)

(58) Field of Classification Search
CPC ..... H01L 2224/48247; H01L 2924/181; H01L 23/49575; H01L 23/49503; H01L 2224/48257
See application file for complete search history.

(56) References Cited

U.S. PATENT DOCUMENTS

| | | |
|---|---|---|
| 3,195,043 A | 7/1965 | Burig et al. |
| 3,281,628 A | 10/1966 | Bauer et al. |

(Continued)

FOREIGN PATENT DOCUMENTS

| | | |
|---|---|---|
| CH | 683 469 | 3/1994 |
| DE | 40 31 560 | 4/1992 |

(Continued)

OTHER PUBLICATIONS

Response to Office Action filed Aug. 9, 2017 for U.S. Appl. No. 13/838,131; 13 pages.
(Continued)

*Primary Examiner* — Ngan V Ngo
(74) *Attorney, Agent, or Firm* — Daly, Crowley Mofford & Durkee, LLP

(57) ABSTRACT

Methods for providing a sensor integrated circuit package including employing a conductive leadframe and forming a non-conductive die paddle in relation to the leadframe. The method can further include placing a die on the non-conductive die paddle to form an assembly, forming at least one electrical connection between the die and the leadframe, and overmolding the assembly to form an integrated circuit package.

12 Claims, 7 Drawing Sheets

Related U.S. Application Data division of application No. 14/090,037, filed on Nov. 26, 2013, now Pat. No. 9,299,915, which is a continuation of application No. 13/350,970, filed on Jan. 16, 2012, now Pat. No. 8,629,539.

(51) Int. Cl.

| | | |
|---|---|---|
| *G01R 33/09* | (2006.01) | |
| *H01L 23/00* | (2006.01) | |
| *H01L 23/31* | (2006.01) | |
| *H01L 43/02* | (2006.01) | |
| *H01L 43/04* | (2006.01) | |
| *H01L 43/06* | (2006.01) | |
| *H01L 43/08* | (2006.01) | |
| *H01L 43/12* | (2006.01) | |
| *H01L 43/14* | (2006.01) | |
| *H01L 23/495* | (2006.01) | |
| *H01L 21/00* | (2006.01) | |

(52) U.S. Cl.
CPC .......... *G01R 33/07* (2013.01); *G01R 33/09* (2013.01); *H01L 23/3107* (2013.01); *H01L 23/3142* (2013.01); *H01L 23/49503* (2013.01); *H01L 23/49506* (2013.01); *H01L 23/49541* (2013.01); *H01L 23/49575* (2013.01); *H01L 24/17* (2013.01); *H01L 43/02* (2013.01); *H01L 43/06* (2013.01); *H01L 43/065* (2013.01); *H01L 43/08* (2013.01); *H01L 43/12* (2013.01); *H01L 43/14* (2013.01); *G01R 33/0052* (2013.01); *H01L 2224/16* (2013.01); *H01L 2224/16245* (2013.01); *H01L 2224/45144* (2013.01); *H01L 2224/4826* (2013.01); *H01L 2224/48091* (2013.01); *H01L 2224/48247* (2013.01); *H01L 2224/48257* (2013.01); *H01L 2224/49171* (2013.01); *H01L 2224/73204* (2013.01); *H01L 2224/73265* (2013.01); *H01L 2924/15311* (2013.01); *H01L 2924/15747* (2013.01); *H01L 2924/181* (2013.01); *H01L 2924/3025* (2013.01); *H01L 2924/30107* (2013.01)

(56) References Cited

U.S. PATENT DOCUMENTS

| | | | |
|---|---|---|---|
| 3,627,901 A | 12/1971 | Happ | |
| 3,661,061 A | 5/1972 | Tokarz | |
| 4,048,670 A | 9/1977 | Eysermans | |
| 4,188,605 A | 2/1980 | Stout | |
| 4,204,317 A | 5/1980 | Winn | |
| 4,210,926 A | 7/1980 | Hacke | |
| 4,262,275 A | 4/1981 | DeMarco et al. | |
| 4,283,643 A | 8/1981 | Levin | |
| 4,315,523 A | 2/1982 | Mahawili et al. | |
| 4,409,608 A | 10/1983 | Yoder | |
| 4,425,596 A | 1/1984 | Satou | |
| 4,614,111 A | 9/1986 | Wolff | |
| 4,642,716 A | 2/1987 | Wakabayashi et al. | |
| 4,733,455 A | 3/1988 | Nakamura et al. | |
| 4,746,859 A | 5/1988 | Malik | |
| 4,769,344 A | 9/1988 | Sakai et al. | |
| 4,772,929 A | 9/1988 | Manchester | |
| 4,893,073 A | 1/1990 | McDonald et al. | |
| 4,908,685 A | 3/1990 | Shibasaki et al. | |
| 4,935,698 A | 6/1990 | Kawaji et al. | |
| 4,994,731 A | 2/1991 | Sanner | |
| 5,010,263 A | 4/1991 | Murata | |
| 5,012,322 A | 4/1991 | Guillotte et al. | |
| 5,021,493 A | 6/1991 | Sandstrom | |
| 5,028,868 A | 7/1991 | Murata et al. | |
| 5,041,780 A | 8/1991 | Rippel | |
| 5,045,920 A | 9/1991 | Vig et al. | |
| 5,068,712 A | 11/1991 | Murakami et al. | |
| 5,077,633 A * | 12/1991 | Freyman | H01L 23/49827 174/255 |
| 5,084,289 A | 1/1992 | Shin et al. | |
| 5,121,289 A | 6/1992 | Gagliardi | |
| 5,124,642 A | 6/1992 | Marx | |
| 5,137,677 A | 8/1992 | Murata | |
| 5,139,973 A | 8/1992 | Nagy et al. | |
| 5,196,794 A | 3/1993 | Murata | |
| 5,196,821 A | 3/1993 | Partin et al. | |
| 5,210,493 A | 5/1993 | Schroeder et al. | |
| 5,216,405 A | 6/1993 | Schroeder et al. | |
| 5,244,834 A | 9/1993 | Suzuki et al. | |
| 5,247,202 A | 9/1993 | Popovic et al. | |
| 5,250,925 A | 10/1993 | Shinkle | |
| 5,286,426 A | 2/1994 | Rano, Jr. et al. | |
| 5,289,344 A | 2/1994 | Gagnon et al. | |
| 5,315,245 A | 5/1994 | Schroeder et al. | |
| 5,399,905 A | 3/1995 | Honda et al. | |
| 5,414,355 A | 5/1995 | Davidson et al. | |
| 5,434,105 A | 7/1995 | Liou | |
| 5,442,228 A | 8/1995 | Pham et al. | |
| 5,453,727 A | 9/1995 | Shibasaki et al. | |
| 5,488,294 A | 1/1996 | Liddell et al. | |
| 5,491,633 A | 2/1996 | Henry et al. | |
| 5,500,589 A | 3/1996 | Sumcad | |
| 5,508,611 A | 4/1996 | Schroeder et al. | |
| 5,539,241 A | 7/1996 | Abidi et al. | |
| 5,561,366 A | 10/1996 | Takahashi et al. | |
| 5,563,199 A | 10/1996 | Harada et al. | |
| 5,579,194 A | 11/1996 | Mackenzie et al. | |
| 5,581,170 A | 12/1996 | Mammano et al. | |
| 5,581,179 A | 12/1996 | Engel et al. | |
| 5,612,259 A | 3/1997 | Okutomo et al. | |
| 5,614,754 A | 3/1997 | Inoue | |
| 5,615,075 A | 3/1997 | Kim | |
| 5,627,315 A | 5/1997 | Figi et al. | |
| 5,631,557 A | 5/1997 | Davidson | |
| 5,648,682 A | 7/1997 | Nakazawa et al. | |
| 5,666,004 A | 9/1997 | Bhattacharyya et al. | |
| 5,691,869 A | 11/1997 | Engel et al. | |
| 5,712,562 A | 1/1998 | Berg | |
| 5,714,405 A | 2/1998 | Tsubosaki et al. | |
| 5,719,496 A | 2/1998 | Wolf | |
| 5,726,577 A | 3/1998 | Engel et al. | |
| 5,729,130 A | 3/1998 | Moody et al. | |
| 5,781,005 A | 7/1998 | Vig et al. | |
| 5,804,880 A | 9/1998 | Mathew | |
| 5,817,540 A | 10/1998 | Wark | |
| 5,818,222 A | 10/1998 | Ramsden | |
| 5,822,849 A | 10/1998 | Casali et al. | |
| 5,859,387 A | 1/1999 | Gagnon | |
| 5,883,567 A | 3/1999 | Mullins, Jr. | |
| 5,891,377 A | 4/1999 | Libres et al. | |
| 5,912,556 A | 6/1999 | Frazee et al. | |
| 5,939,779 A | 8/1999 | Kim | |
| 5,940,256 A | 8/1999 | MacKenzie et al. | |
| 5,963,028 A | 10/1999 | Engel et al. | |
| 5,973,388 A | 10/1999 | Chew et al. | |
| 6,005,383 A | 12/1999 | Savary et al. | |
| 6,016,055 A | 1/2000 | Jager et al. | |
| 6,057,997 A | 5/2000 | MacKenzie et al. | |
| 6,066,890 A | 5/2000 | Tsui et al. | |
| 6,072,228 A | 6/2000 | Hinkle et al. | |
| 6,097,109 A | 8/2000 | Fendt et al. | |
| 6,150,714 A | 11/2000 | Andreycak et al. | |
| 6,175,233 B1 | 1/2001 | McCurley et al. | |
| 6,178,514 B1 | 1/2001 | Wood | |
| 6,184,679 B1 | 2/2001 | Popovic et al. | |
| 6,225,701 B1 | 5/2001 | Hori et al. | |
| 6,252,389 B1 | 6/2001 | Baba et al. | |
| 6,265,865 B1 | 7/2001 | Engel et al. | |
| 6,278,269 B1 | 8/2001 | Vig et al. | |
| 6,294,824 B1 | 9/2001 | Brooks et al. | |
| 6,316,736 B1 | 11/2001 | Jairazbhoy et al. | |
| 6,316,931 B1 | 11/2001 | Nakagawa et al. | |
| 6,323,634 B1 | 11/2001 | Nakagawa et al. | |
| 6,356,068 B1 | 3/2002 | Steiner et al. | |

(56) References Cited

U.S. PATENT DOCUMENTS

| | | |
|---|---|---|
| 6,359,331 B1 | 3/2002 | Rinehart et al. |
| 6,388,336 B1 | 5/2002 | Venkateshwaren et al. |
| 6,396,712 B1 | 5/2002 | Kuijk |
| 6,411,078 B1 | 6/2002 | Nakagawa et al. |
| 6,420,779 B1 | 7/2002 | Sharma et al. |
| 6,424,018 B1 | 7/2002 | Ohtsuka |
| 6,429,652 B1 | 8/2002 | Allen et al. |
| 6,445,171 B2 | 9/2002 | Sandquist et al. |
| 6,452,381 B1 | 9/2002 | Nakatani et al. |
| 6,462,531 B1 | 10/2002 | Ohtsuka |
| 6,480,699 B1 | 11/2002 | Lovoi |
| 6,482,680 B1 | 11/2002 | Khor et al. |
| 6,486,535 B2 | 11/2002 | Liu |
| 6,501,268 B1 | 12/2002 | Edelstein et al. |
| 6,501,270 B1 | 12/2002 | Opie |
| 6,504,366 B2 | 1/2003 | Bodin et al. |
| 6,545,332 B2 | 4/2003 | Huang |
| 6,545,456 B1 | 4/2003 | Radosevich et al. |
| 6,545,457 B2 | 4/2003 | Goto et al. |
| 6,545,462 B2 | 4/2003 | Schott et al. |
| 6,563,199 B2 | 5/2003 | Yasunaga et al. |
| 6,566,856 B2 | 5/2003 | Sandquist et al. |
| 6,577,012 B1 | 6/2003 | Greenwood et al. |
| 6,583,572 B2 | 6/2003 | Veltrop et al. |
| 6,593,545 B1 | 7/2003 | Greenwood et al. |
| 6,605,491 B1 | 8/2003 | Hsieh et al. |
| 6,608,375 B2 | 8/2003 | Terui et al. |
| 6,610,923 B1 | 8/2003 | Nagashima et al. |
| 6,616,736 B2 | 9/2003 | Massey et al. |
| 6,617,846 B2 | 9/2003 | Hayat-Dawoodi et al. |
| 6,642,609 B1 | 11/2003 | Minamio et al. |
| 6,642,705 B2 | 11/2003 | Kawase |
| 6,667,682 B2 | 12/2003 | Wan et al. |
| 6,683,448 B1 | 1/2004 | Ohtsuka |
| 6,683,452 B2 | 1/2004 | Lee et al. |
| 6,692,676 B1 | 2/2004 | Vig et al. |
| 6,696,952 B2 | 2/2004 | Zirbes |
| 6,713,836 B2 | 3/2004 | Liu et al. |
| 6,714,003 B2 | 3/2004 | Babin |
| 6,727,683 B2 | 4/2004 | Goto et al. |
| 6,737,298 B2 | 5/2004 | Shim et al. |
| 6,747,300 B2 | 6/2004 | Nadd et al. |
| 6,759,841 B2 | 7/2004 | Goto et al. |
| 6,770,163 B1 | 8/2004 | Kuah et al. |
| 6,775,140 B2 | 8/2004 | Shim et al. |
| 6,781,359 B2 | 8/2004 | Stauth et al. |
| 6,789,057 B1 | 9/2004 | Bolkin et al. |
| 6,791,313 B2 | 9/2004 | Ohtsuka |
| 6,796,485 B2 | 9/2004 | Seidler |
| 6,798,044 B2 | 9/2004 | Joshi |
| 6,798,057 B2 | 9/2004 | Bolkin et al. |
| 6,798,193 B2 | 9/2004 | Zimmerman et al. |
| 6,809,416 B1 | 10/2004 | Sharma |
| 6,812,687 B1 | 11/2004 | Ohtsuka |
| 6,825,067 B2 | 11/2004 | Ararao et al. |
| 6,828,220 B2 | 12/2004 | Pendse et al. |
| 6,832,420 B2 | 12/2004 | Liu |
| 6,841,989 B2 | 1/2005 | Goto et al. |
| 6,853,178 B2 | 2/2005 | Hayat-Dawoodi |
| 6,861,283 B2 | 3/2005 | Sharma |
| 6,867,573 B1 | 3/2005 | Carper |
| 6,875,634 B2 | 4/2005 | Shim et al. |
| 6,921,955 B2 | 7/2005 | Goto et al. |
| 6,956,282 B1 * | 10/2005 | Alvarez ............ H01L 23/49506 257/666 |
| 6,960,493 B2 | 11/2005 | Ararao et al. |
| 6,974,909 B2 | 12/2005 | Tanaka et al. |
| 6,989,665 B2 | 1/2006 | Goto et al. |
| 6,995,315 B2 | 2/2006 | Sharma et al. |
| 7,005,325 B2 | 2/2006 | Chow et al. |
| 7,006,749 B2 | 2/2006 | Illich et al. |
| 7,026,808 B2 | 4/2006 | Vig et al. |
| 7,046,002 B1 | 5/2006 | Edelstein |
| 7,075,287 B1 | 7/2006 | Mangtani et al. |
| 7,129,691 B2 | 10/2006 | Shibahara et al. |
| 7,148,086 B2 | 12/2006 | Shim et al. |
| 7,166,807 B2 | 1/2007 | Gagnon et al. |
| 7,193,412 B2 | 3/2007 | Freeman |
| 7,221,045 B2 | 5/2007 | Park et al. |
| 7,248,045 B2 | 7/2007 | Shoji |
| 7,250,760 B2 | 7/2007 | Ao |
| 7,259,545 B2 | 8/2007 | Stauth et al. |
| 7,259,624 B2 | 8/2007 | Barnett |
| 7,265,531 B2 | 9/2007 | Stauth et al. |
| 7,269,992 B2 | 9/2007 | Lamb et al. |
| 7,285,952 B1 | 10/2007 | Hatanaka et al. |
| 7,304,370 B2 | 12/2007 | Imaizumi et al. |
| 7,323,870 B2 | 1/2008 | Tatschl et al. |
| 7,355,388 B2 | 4/2008 | Ishio |
| 7,358,724 B2 | 4/2008 | Taylor et al. |
| 7,361,531 B2 | 4/2008 | Sharma et al. |
| 7,378,721 B2 | 5/2008 | Frazee et al. |
| 7,378,733 B1 | 5/2008 | Hoang et al. |
| 7,385,394 B2 | 6/2008 | Auburger et al. |
| 7,476,816 B2 | 1/2009 | Doogue et al. |
| 7,476,953 B2 | 1/2009 | Taylor et al. |
| 7,518,493 B2 | 4/2009 | Bryzek et al. |
| 7,557,563 B2 | 7/2009 | Gunn et al. |
| 7,573,112 B2 | 8/2009 | Taylor |
| 7,598,601 B2 | 10/2009 | Taylor et al. |
| 7,676,914 B2 | 3/2010 | Taylor |
| 7,687,882 B2 | 3/2010 | Taylor et al. |
| 7,696,006 B1 | 4/2010 | Hoang et al. |
| 7,709,754 B2 | 5/2010 | Doogue et al. |
| 7,768,083 B2 | 8/2010 | Doogue et al. |
| 7,777,607 B2 | 8/2010 | Taylor et al. |
| 7,816,772 B2 | 10/2010 | Engel et al. |
| 7,816,905 B2 | 10/2010 | Doogue et al. |
| 7,939,372 B1 | 5/2011 | Chang |
| 8,080,994 B2 | 12/2011 | Taylor et al. |
| 8,093,670 B2 | 1/2012 | Taylor |
| 8,143,169 B2 | 3/2012 | Engel et al. |
| 8,629,539 B2 * | 1/2014 | Milano ............... G01R 33/0076 257/676 |
| 9,283,772 B2 | 3/2016 | Perez Gellida et al. |
| 9,299,915 B2 | 3/2016 | Milano et al. |
| 9,411,025 B2 | 8/2016 | David et al. |
| 2001/0028114 A1 | 10/2001 | Hosomi |
| 2001/0028115 A1 | 10/2001 | Yanagawa et al. |
| 2001/0030537 A1 | 10/2001 | Honkura et al. |
| 2001/0052780 A1 | 12/2001 | Hayat-Dawoodi |
| 2002/0005780 A1 | 1/2002 | Ehrlich et al. |
| 2002/0020907 A1 | 2/2002 | Seo et al. |
| 2002/0027488 A1 | 3/2002 | Hayat-Dawoodi et al. |
| 2002/0041179 A1 | 4/2002 | Gohara et al. |
| 2002/0068379 A1 | 6/2002 | Cobbley et al. |
| 2002/0179987 A1 | 12/2002 | Meyer et al. |
| 2002/0195693 A1 | 12/2002 | Liu et al. |
| 2003/0038464 A1 | 2/2003 | Furui |
| 2003/0039062 A1 | 2/2003 | Takahasahi |
| 2003/0067057 A1 | 4/2003 | Wu |
| 2003/0164548 A1 | 9/2003 | Lee |
| 2003/0209784 A1 | 11/2003 | Schmitz et al. |
| 2003/0230792 A1 | 12/2003 | Wu et al. |
| 2004/0032251 A1 | 2/2004 | Zimmerman et al. |
| 2004/0038452 A1 | 2/2004 | Pu |
| 2004/0046248 A1 | 3/2004 | Waelti et al. |
| 2004/0056647 A1 | 3/2004 | Stauth et al. |
| 2004/0080308 A1 | 4/2004 | Goto |
| 2004/0080314 A1 | 4/2004 | Tsujii et al. |
| 2004/0094826 A1 | 5/2004 | Yang et al. |
| 2004/0135220 A1 | 7/2004 | Goto |
| 2004/0135574 A1 | 7/2004 | Hagio et al. |
| 2004/0145043 A1 | 7/2004 | Hayashi et al. |
| 2004/0155644 A1 | 8/2004 | Stauth et al. |
| 2004/0174655 A1 | 9/2004 | Tsai et al. |
| 2004/0184196 A1 | 9/2004 | Jayasekara |
| 2004/0207035 A1 | 10/2004 | Witcraft et al. |
| 2004/0207077 A1 | 10/2004 | Leal et al. |
| 2004/0207398 A1 | 10/2004 | Kudo et al. |
| 2004/0207400 A1 | 10/2004 | Witcraft et al. |
| 2004/0212053 A1 | 10/2004 | Koh et al. |
| 2004/0222503 A1 * | 11/2004 | Lee ..................... H01L 21/568 257/678 |

(56) References Cited

U.S. PATENT DOCUMENTS

| | | |
|---|---|---|
| 2004/0251557 A1 | 12/2004 | Kee |
| 2004/0262718 A1 | 12/2004 | Ramakrishna |
| 2004/0263148 A1 | 12/2004 | Takabatake |
| 2005/0035448 A1 | 2/2005 | Hsu et al. |
| 2005/0040814 A1 | 2/2005 | Vig et al. |
| 2005/0045359 A1 | 3/2005 | Doogue et al. |
| 2005/0139972 A1 | 6/2005 | Chiu et al. |
| 2005/0151448 A1 | 7/2005 | Hikida et al. |
| 2005/0167790 A1 | 8/2005 | Khor et al. |
| 2005/0173783 A1 | 8/2005 | Chow et al. |
| 2005/0194676 A1 | 9/2005 | Fukuda et al. |
| 2005/0224248 A1 | 10/2005 | Gagnon et al. |
| 2005/0230843 A1 | 10/2005 | Williams |
| 2005/0236698 A1 | 10/2005 | Ozawa et al. |
| 2005/0248005 A1 | 11/2005 | Hayat-Dawoodi |
| 2005/0248336 A1 | 11/2005 | Sharma et al. |
| 2005/0253507 A1 | 11/2005 | Fujimura et al. |
| 2005/0266611 A1 | 12/2005 | Tu et al. |
| 2005/0270748 A1 | 12/2005 | Hsu |
| 2005/0274982 A1 | 12/2005 | Ueda et al. |
| 2005/0280411 A1 | 12/2005 | Bicking |
| 2006/0002147 A1 | 1/2006 | Hong et al. |
| 2006/0033487 A1 | 2/2006 | Nagano et al. |
| 2006/0038289 A1 | 2/2006 | Hsu et al. |
| 2006/0038560 A1 | 2/2006 | Kurumado |
| 2006/0068237 A1 | 3/2006 | Murphy et al. |
| 2006/0071655 A1 | 4/2006 | Shoji |
| 2006/0077598 A1 | 4/2006 | Taylor et al. |
| 2006/0091993 A1 | 5/2006 | Shoji |
| 2006/0113988 A1* | 6/2006 | Hall ............... G01D 5/145 324/207.2 |
| 2006/0114098 A1 | 6/2006 | Shoji |
| 2006/0145690 A1 | 7/2006 | Shoji |
| 2006/0152210 A1 | 7/2006 | Mangtani et al. |
| 2006/0170529 A1 | 8/2006 | Shoji |
| 2006/0175674 A1 | 8/2006 | Taylor et al. |
| 2006/0181263 A1 | 8/2006 | Doogue et al. |
| 2006/0219436 A1 | 10/2006 | Taylor et al. |
| 2006/0238190 A1 | 10/2006 | Ishio |
| 2006/0255797 A1 | 11/2006 | Taylor et al. |
| 2006/0261801 A1 | 11/2006 | Busch |
| 2006/0267135 A1 | 11/2006 | Wolfgang et al. |
| 2006/0291106 A1 | 12/2006 | Shoji |
| 2007/0007631 A1 | 1/2007 | Knittl |
| 2007/0018290 A1 | 1/2007 | Punzalan et al. |
| 2007/0018642 A1 | 1/2007 | Ao |
| 2007/0044370 A1 | 3/2007 | Shoji |
| 2007/0076332 A1 | 4/2007 | Shoji |
| 2007/0085174 A1* | 4/2007 | Wheless, Jr. ...... H01L 23/49531 257/666 |
| 2007/0090825 A1 | 4/2007 | Shoji |
| 2007/0096716 A1 | 5/2007 | Shoji |
| 2007/0099348 A1 | 5/2007 | Sharma et al. |
| 2007/0138651 A1 | 6/2007 | Hauenstein |
| 2007/0170533 A1 | 7/2007 | Doogue et al. |
| 2007/0188946 A1 | 8/2007 | Shoji |
| 2007/0241423 A1 | 10/2007 | Taylor et al. |
| 2007/0243705 A1 | 10/2007 | Taylor |
| 2007/0279053 A1 | 12/2007 | Taylor et al. |
| 2008/0013298 A1 | 1/2008 | Sharma et al. |
| 2008/0018261 A1 | 1/2008 | Kastner |
| 2008/0034582 A1 | 1/2008 | Taylor |
| 2008/0036453 A1 | 2/2008 | Taylor |
| 2008/0230879 A1 | 9/2008 | Sharma et al. |
| 2008/0237818 A1 | 10/2008 | Engel et al. |
| 2008/0297138 A1 | 12/2008 | Taylor et al. |
| 2008/0308886 A1 | 12/2008 | Ausserlechner et al. |
| 2009/0058412 A1 | 3/2009 | Taylor et al. |
| 2009/0083963 A1* | 4/2009 | Otremba ........... H01L 23/49562 29/592.1 |
| 2009/0102034 A1 | 4/2009 | Pagkaliwangan et al. |
| 2009/0121704 A1 | 5/2009 | Shibahara |
| 2009/0122437 A1 | 5/2009 | Gong et al. |
| 2009/0140725 A1 | 6/2009 | Ausserlechner |
| 2009/0152696 A1 | 6/2009 | Dimasacat et al. |
| 2010/0019332 A1 | 1/2010 | Taylor |
| 2010/0141249 A1 | 6/2010 | Ararao et al. |
| 2010/0188078 A1 | 7/2010 | Foletto et al. |
| 2010/0201356 A1 | 8/2010 | Koller et al. |
| 2010/0237450 A1 | 9/2010 | Doogue et al. |
| 2010/0276769 A1 | 11/2010 | Theuss et al. |
| 2010/0295140 A1 | 11/2010 | Theuss et al. |
| 2010/0330708 A1 | 12/2010 | Engel et al. |
| 2011/0031947 A1 | 2/2011 | You |
| 2011/0050222 A1 | 3/2011 | Ueno et al. |
| 2011/0068447 A1 | 3/2011 | Camacho et al. |
| 2011/0068779 A1* | 3/2011 | Werth .................. B82Y 25/00 324/207.25 |
| 2011/0127998 A1 | 6/2011 | Elain et al. |
| 2011/0133732 A1 | 6/2011 | Sauber |
| 2011/0175598 A1 | 7/2011 | Doering et al. |
| 2011/0204887 A1 | 8/2011 | Ausserlechner et al. |
| 2011/0267039 A1 | 11/2011 | Musselman et al. |
| 2011/0304327 A1 | 12/2011 | Ausserlechner |
| 2012/0013333 A1 | 1/2012 | Ararao et al. |
| 2012/0086090 A1 | 4/2012 | Sharma et al. |
| 2012/0153446 A1 | 6/2012 | Jiang |
| 2012/0153447 A1 | 6/2012 | Jiang |
| 2013/0026615 A1* | 1/2013 | Gong ................. H01L 23/3107 257/675 |
| 2013/0249027 A1 | 9/2013 | Taylor et al. |
| 2013/0249029 A1 | 9/2013 | Vig et al. |
| 2013/0249544 A1 | 9/2013 | Vig et al. |
| 2013/0249546 A1 | 9/2013 | David et al. |
| 2017/0148692 A1* | 5/2017 | Pavier ................. H01L 23/043 |

FOREIGN PATENT DOCUMENTS

| | | |
|---|---|---|
| DE | 4 141 386 | 6/1993 |
| DE | 102 31 194 | 2/2004 |
| DE | 103 14 602 | 10/2004 |
| DE | 10 2004 054317 | 5/2006 |
| DE | 10 2004 060 298 | 6/2006 |
| DE | 10 2004 060298 A1 | 6/2006 |
| DE | 10 2007 018 238 | 10/2008 |
| DE | 10 2008 064047 A1 | 4/2010 |
| DE | 10 2009 000 460 A1 | 7/2010 |
| EP | 0 361 456 | 4/1990 |
| EP | 0409173 A2 | 1/1991 |
| EP | 0 537 419 | 4/1993 |
| EP | 0 680 103 | 11/1995 |
| EP | 0 867 725 | 9/1998 |
| EP | 0 898 180 | 2/1999 |
| EP | 1 107 327 | 6/2001 |
| EP | 1 107 328 | 6/2001 |
| EP | 1 111 693 | 6/2001 |
| EP | 1160887 A2 | 12/2001 |
| EP | 1 180 804 | 2/2002 |
| EP | 1281974 | 2/2003 |
| EP | 1 443 332 | 8/2004 |
| EP | 0944839 | 3/2006 |
| EP | 2366976 A1 | 9/2011 |
| FR | 2 748 105 | 10/1997 |
| GB | 2191632 | 12/1987 |
| GB | 2273782 | 6/1994 |
| JP | S54-182859 | 12/1979 |
| JP | 363 084176 | 4/1988 |
| JP | 63-191069 | 8/1988 |
| JP | 63 263782 | 10/1988 |
| JP | 1 184885 | 7/1989 |
| JP | 01207909 | 8/1989 |
| JP | 04 152688 | 5/1992 |
| JP | 4-357858 A | 12/1992 |
| JP | 4-364472 | 12/1992 |
| JP | 61-71649 | 6/1994 |
| JP | 8097486 | 4/1996 |
| JP | 8-264569 | 10/1996 |
| JP | 8-264569 A | 10/1996 |
| JP | 9079865 | 3/1997 |
| JP | 9166612 | 6/1997 |
| JP | H09-232373 | 9/1997 |
| JP | 10-56129 | 2/1998 |
| JP | 11074142 | 3/1999 |
| JP | 2000-174357 | 6/2000 |

(56) References Cited

FOREIGN PATENT DOCUMENTS

| | | |
|---|---|---|
| JP | 2000-183241 | 6/2000 |
| JP | 2000-294692 | 10/2000 |
| JP | 2001-116815 | 4/2001 |
| JP | 2001-141738 | 5/2001 |
| JP | 2001-165702 | 6/2001 |
| JP | 2001-165963 | 6/2001 |
| JP | 2001-174486 | 6/2001 |
| JP | 2001-221815 | 8/2001 |
| JP | 2001-230467 | 8/2001 |
| JP | 2001-339109 | 12/2001 |
| JP | 2002-026419 | 1/2002 |
| JP | 2002-040058 | 2/2002 |
| JP | 2002-202327 | 7/2002 |
| JP | 2003-177171 | 6/2003 |
| JP | 2004-55932 | 2/2004 |
| JP | 2004-55932 A | 2/2004 |
| JP | 2004 055932 A | 2/2004 |
| JP | 2004-356338 | 12/2004 |
| JP | 2005327859 | 11/2005 |
| JP | 2005-345302 | 12/2005 |
| JP | 2007-218799 | 8/2007 |
| JP | 2008-513632 | 12/2007 |
| TW | I240978 B | 10/2005 |
| WO | WO 9007176 | 6/1990 |
| WO | WO 99/14605 | 3/1999 |
| WO | WO 0054068 | 9/2000 |
| WO | WO 0069045 | 11/2000 |
| WO | WO 01/23899 | 4/2001 |
| WO | WO 01/74139 | 10/2001 |
| WO | WO 03 107018 | 12/2003 |
| WO | WO 2004 027436 | 4/2004 |
| WO | WO 2005/013363 | 2/2005 |
| WO | WO 2005/026749 | 3/2005 |
| WO | WO 2006/037695 A1 | 4/2006 |
| WO | WO 2006/060330 | 6/2006 |
| WO | WO 2006/083479 | 8/2006 |
| WO | WO 2006/124252 | 11/2006 |
| WO | WO 2006/130393 | 12/2006 |
| WO | WO 2007/053383 | 5/2007 |
| WO | WO 2008/008140 | 1/2008 |
| WO | WO 2008/121443 | 10/2008 |
| WO | WO 2010/065315 | 6/2010 |
| WO | WO 2011/068653 | 6/2011 |
| WO | WO 2013/142112 | 7/2013 |
| WO | WO 2013/109355 | 9/2013 |
| WO | WO 2013141981 | 9/2013 |

OTHER PUBLICATIONS

Office Action dated Jun. 8, 2017 for U.S. Appl. No. 13/838,131: 16 pages.
Amendment in response to Final Office Action dated Feb. 22, 2017 and filed May 2, 2017 for U.S. Appl. No. 13/838,131, 12 pages.
Request for Continued Examination filed on May 16, 2017 for U.S. Appl. No. 13/838,131; 3 pages.
Response to Final Office Action filed on May 2, 2017 for U.S. Appl. No. 13/838,131, 12 pages.
U.S. Appl. No. 10/831,906, filed Apr. 26, 2004, Stauth et al.
U.S. Appl. No. 10/962,889, filed Oct. 12, 2004, Taylor et al.
U.S. Appl. No. 11/051,124, filed Feb. 4, 2005, Taylor et al.
U.S. Appl. No. 11/129,933, filed May 16, 2005, Taylor et al.
U.S. Appl. No. 11/140,250, filed May 27, 2005, Doogue et al.
U.S. Appl. No. 11/144,970, filed Jun. 3, 2005, Gagnon et al.
U.S. Appl. No. 11/335,944, filed Jan. 20, 2006, Doogue et al.
U.S. Appl. No. 11/336,602, filed Jan. 20, 2006, Mangtani et al.
U.S. Appl. No. 11/383,021, filed May 12, 2006, Taylor et al.
U.S. Appl. No. 11/401,160, filed Apr. 10, 2006, Doogue et al.
U.S. Appl. No. 11/457,626, filed Jul. 14, 2006, Sharma et al.
U.S. Appl. No. 11/776,242, filed Jul. 11, 2007, Taylor et al.
U.S. Appl. No. 12/171,651, filed Jul. 11, 2008, Taylor et al.
U.S. Appl. No. 12/178,781, filed Jul. 24, 2008, Taylor.
U.S. Appl. No. 12/261,629, filed Oct. 30, 2008, Taylor et al.
U.S. Appl. No. 12/360,889, filed Jan. 28, 2009, Foletto et al.
U.S. Appl. No. 13/241,380, filed Sep. 23, 2011, Ararao et al.
Japanese Patent Application No. 2013-107637 Office Action dated May 1, 2014 including English Translation Only, 3 pages.
International Search Report and Written Opinion dated Jul. 28, 2014 for PCT Application No. PCT/US2014/032125; 18 pages.
Office Action dated Aug. 1, 2014 for U.S. Appl. No. 13/871,131; 41 pages.
Japanese Notice of Reasons for Rejection (English translation); dated Jul. 16, 2013; for Japanese Pat. App. No. 2011-539582; 3 pages.
Notice of Allowance; dated Mar. 1, 2013; for U.S. Appl. No. 12/328,798; 10 pages.
Supplemental Notice of Allowability; dated May 10, 2013; for U.S. Appl. No. 12/328,798; 5 pages.
Notice of Allowance; dated Feb. 21, 2013; for U.S. Appl. No. 13/241,380; 9 pages.
Supplemental Notice of Allowability; dated May 1, 2013; for U.S. Appl. No. 13/241,380; 5 pages.
PCT Invitation to Pay Additional Fees and Partial Search Report of the ISA; dated Jul. 8, 2013; for PCT Pat. App. No. PCT/US2013/025858; 6 pages.
PCT Invitation to Pay Additional Fees and Partial Search Report of the ISA; dated Jul. 1, 2013; for PCT Pat. App. No. PCT/US2013/030112; 7 pages.
Korean Patent Application No. 10-2009-7021132 Email from foreign associate dated Apr. 1, 2014 regarding office action received and listing of references from office action (translation of each reference listed above), 2 pages.
Response as filed on Sep. 26, 2014 for U.S. Appl. No. 13/871,131; 14 pages.
Final Office Action dated Mar. 11, 2014; for U.S. Appl. No. 12/360,889 23 pages.
Chinese Office Action from Chinese Patent Application No. 201110285150.8, including English translation, 15 pages.
Response to Chinese Office Action filed on Dec. 16, 2013 from Chinese Patent Application No. 201110285150.8, including Applicant's instruction letter to foreign associate, foreign associate emailed response and foreign associate cover letter attached to filed response, 11 pages.
Notification, Search Report and Written Opinion dated Sep. 3, 2013 for PCT Application No. PCT/US2013/030112, filed Mar. 11, 2013, 29 pages.
Notification, Search Report and Written Opinion dated Sep. 25, 2013 for PCT Application No. PCT/US2013/025858, filed Feb. 13, 2013, 37 pages.
Office Action dated Mar. 10, 2015 for U.S. Appl. No. 13/788,210; 12 pages.
Chinese Office Action (and English translation) dated Sep. 10, 2010 (6 pages) for Chinese Patent Application No. 200880008895.6, from which present U.S. Application claims priority, 12 pages.
Chinese Office Action for Chinese Application No. CN 2004 80024296.5 dated Apr. 29, 2009 (PCT/US2004/009908).
Chinese Office Action for Chinese Application No. CN 2004 80024296.5 dated Sep. 26, 2008 (PCT/US2004/009908).
Chinese Office Action for Chinese Application No. CN 2004 80024296.5 dated May 6, 2008 (PCT/US2004/009908).
Chinese Office Action for Chinese Application No. CN 2004 80024296.5 dated Nov. 23, 2007 (PCT/US2004/009908).
EP Office Action dated Feb. 23, 2011 for EP Pat. App. No. 09 000 121.5.
EP Office Action dated Jan. 2, 2008 for EP Pat. App. No. 04816162.4, (PCT/US2004/009908).
EP Office Action dated Jun. 17, 2009; for EP Pat. App. No. 048163162.4.
EP Office Action dated Jun. 27, 2007 for EP Pat. App. No. 04816162.4, (PCT/US2004/009908).
EP Official Communication; dated May 16, 2008; for EP Pat. App. No. 06 770 974.1-2216; 4 pages.
EP Search Report of the EPO for EP09000121.5 dated Feb. 10, 2010, 5 pages.
EP Search Report of the EPO for EP09000123.1 dated Jan. 22, 2010, 5 pages.

(56) References Cited

OTHER PUBLICATIONS

EP Search Report of the EPO for EP10183958.7 dated Feb. 4, 2011, 6 pages.
EP Communication under Rule 71(e); dated Apr. 27, 2009; for EP Pat. App. No. 06 770 974.1-2216; 6 pages.
Invitation to Pay Additional Fees and, Where Applicable, Protest Fee; and Partial International Search Report, and Patent Family Annex, PCT/US/2009/054254, dated Jan. 11, 2010, 6 pages.
Invitation to Pay Additional Fees from the International Searching Authority, PCT/US2006/041580, dated Mar. 9, 2007, 6 pages.
Japanese Amendment filed on Aug. 18, 2011; for JP Pat. App. No. 2008-513632; 9 pages.
Japanese Amendment filed on Aug. 18, 2011; for JP Pat. App. No. 2010-281774; 5 pages.
Japanese Amendment filed on Aug. 18, 2011; for JP Pat. App. No. 2010-281828; 6 pages.
Japanese Amendment filed on Aug. 18, 2011; for JP Pat. App. No. 2010-281841; 7 pages.
Japanese Amendment filed on Sep. 21, 2011; for JP Pat. App. No. 2010-281804; 8 pages.
Japanese Amendment with full English Translation; filed Sep. 28, 2011; for JP Pat. App. No. 2009-151851; 9 pages.
Japanese Office Action for JP Pat. App. No. JP 2006-524610 dated Apr. 23, 2009 (PCT/US2004/009908), 5 pages.
Japanese Office Action dated Sep. 21, 2010 for JP2008-513632; English Translation; 2 pages.
Japanese Office Action English translation dated Jun. 17, 2011 for JP Pat. App. No. 2008-513632; 6 pages.
Japanese Office Action English translation dated Jun. 21, 2011 for JP Pat. App. No. 2010-281774; 2 pages.
Japanese Office Action English translation dated Jun. 21, 2011 for JP Pat. App. No. 2010-281804; 2 pages.
Japanese Office Action English translation dated Jun. 23, 2011 for JP Pat. App. No. 2010-281828; 2 pages.
Japanese Office Action English translation dated Jun. 23, 2011 for JP Pat. App. No. 2010-281841; 2 pages.
Japanese Office Action English translation dated May 16, 2011 for JP Pat. App. No. 2009-151851; 1 page.
Japanese Office Action for Japanese Application No. JP 2006-524610 dated May 28, 2008 (PCT/US2004/009908), 4 pages.
Japanese Office Action Response for Application No. JP 2006-524610 filed Sep. 4, 2008 (PCT/US2004/009908), 10 pages.
Korean Response to Office Action dated Jul. 22, 2010 for KR 10-2006-7002842; English Translation; 7 pages.
Korean Office Action (with English translation) dated Jul. 22, 2010 for KR App. No. 10-2006-7002842, 9 pages.
Korean Response to Office Action dated Jul. 22, 2010 for KR 10-2006-7002842; English Translation; 11 pages.
Letter from Yuasa and Hara dated Oct. 29, 2013; for Japanese Pat. App. No. 2011-539582; 2 pages.
Letter from Yuasa and Hara including a response as filed on Aug. 18, 2011 for JP Pat. App. No. 2008-513632; 9 pages.
Letter to Yuasa and Hara including a First Set of Draft Claim Amendments for Consideration and a Second Set of Draft Claim Amendments for Consideration; dated Jul. 18, 2011; for JP Pat. App. No. 2008-513632; 14 pages.
Notice of Allowance dated Feb. 3, 2012; for U.S. Appl. No. 12/878,134; 7 pages.
Notice of Allowance dated Jun. 10, 2009; for U.S. Appl. No. 12/171,651, now U.S. Pat. No. 7,598,601; 16 pages.
Notice of Allowance dated Jun. 4, 2008; for U.S. Appl. No. 11/383,021; 9 pages.
Notice of Allowance in U.S. Appl. No. 13/350,970 dated Sep. 3, 2013, 10 pages.
Notification Concerning Transmittal of International Preliminary Report on Patentability (Chapter 1 of the Patent Cooperation Treaty), PCT/US2008/053551, dated Oct. 8, 2009, 7 pages.
Notification Concerning Transmittal of International Preliminary Report on Patentability (Chapter 1 of the Patent Cooperation Treaty), PCT/US2009/065044; dated Jun. 16, 2011, 8 pages.
Notification Concerning Transmittal of International Preliminary Report on Patentability (Chapter 1 of the Patent Cooperation Treaty), PCT/US2006/016531, dated Nov. 29, 2007, 9 pages.
Notification Concerning Transmittal of International Preliminary Report on Patentability, (Chapter 1 of the Patent Cooperation Treaty), Written Opinion of the International Searching Authority, PCT/US2006/019953, dated Dec. 13, 2007, 7 pages.
Notification Concerning Transmittal of International Preliminary Report on Patentability, (Chapter 1 of the Patent Cooperation Treaty), PCT/US2004/009908, dated Feb. 27, 2006, 4 pages.
Notification Concerning Transmittal of International Preliminary Report on Patentability (Chapter 1 of the Patent Cooperation Treaty), PCT/US2007/013358 dated Jan. 22, 2009, 7 pages.
Notification Concerning Transmittal of International Preliminary Report on Patentability (Chapter 1 of the Patent Cooperation Treaty), PCT/US2009/054254, dated Mar. 10, 2011, 14 pages.
Notification Concerning Transmittal of International Preliminary Report on Patentability (Chapter I of the Patent Cooperation Treaty), PCT/US2007/008920 dated Oct. 23, 2008, 7 pages.
Notification Concerning Transmittal of International Preliminary Report on Patentability (Chapter 1 of the Patent Cooperation Treaty), PCT/US2010/056434; dated Jun. 14, 2012, 12 pages.
Notification Concerning Transmittal of International Preliminary Report on Patentability (Chapter 1 of the Patent Cooperation Treaty), PCT/US2006/014580, dated May 15, 2008, 15 pages.
Notification Concerning Transmittal of International Preliminary Report on Patentability (Chapter 1 of the Patent Cooperation Treaty), PCT/US2006/000363, dated Aug. 16, 2007, 10 pages.
Notification of Transmittal of the International Search Report and Written Opinion of the International Searching Authority, or the Declaration, PCT/US2004/009908 dated Aug. 16, 2004, 13 pages.
Notification of Transmittal of the International Search Report and Written Opinion of the International Searching Authority, or the Declaration, PCT/US2006/019953 dated Sep. 25, 2006, 9 pages.
Notification of Transmittal of the International Search Report and Written Opinion of the International Searching Authority, or the Declaration, PCT/US2008/053551, dated Jul. 15, 2008, 12 pages.
Notification of Transmittal of the International Search Report and Written Opinion of the International Searching Authority, or the Declaration, PCT/US2006/000363 dated May 11, 2006, 14 pages.
Notification of Transmittal of the International Search Report and Written Opinion of the International Searching Authority, or the Declaration, PCT/US2009/065044 dated Jan. 7, 2010, 12 pages.
Notification of Transmittal of the International Search Report and Written Opinion of the International Searching Authority, or the Declaration, PCT/US2006/016531 dated Nov. 13, 2006, 14 pages.
Notification of transmittal of the International Search Report and the Written Opinion of the International Searching Authority, or the Declaration PCT/US2007/013358, dated Feb. 28, 2008, 12 pages.
Notification of transmittal of the International Search Report and the Written Opinion of the International Searching Authority, or the Declaration, PCT/US2007/008920 dated Oct. 23, 2007, 11 pages.
Notification of Transmittal of the International Search Report and the Written Opinion of the International Searching Authority, or the Declaration, PCT/US2010/056434 dated Jan. 26, 2011, 16 pages.
Notification of Transmittal of the International Search Report and the Written Opinion of the International Searching Authority, or the Declaration; PCT/US2009/054254 dated Jun. 2, 2010, 22 pages.
Notification of Transmittal of The International Search Report and Written Opinion of the International Searching Authority, or the Declaration, PCT/US2006/041580, dated Jun. 4, 2007, 24 pages.
Notification of Transmittal of the International Search Report and the Written Opinion of the International Searching Authority, or the Declaration, PCT/US2012/068912, dated Apr. 24, 2013, 15 pages.
Office Action dated Feb. 22, 2012 for U.S. Appl. No. 13/241,380, 23 pages.
Office Action dated Jan. 17, 2012; for U.S. Appl. No. 12/360,889; 13 pages.
Office Action dated Jul. 21, 2011 from U.S. Appl. No. 12/360,889, filed Jan. 28, 2009, 18 pages.
Office Action dated Jun. 28, 2013; for U.S. Appl. No. 12/360,889; 7 pages.

(56) References Cited

OTHER PUBLICATIONS

Office Action dated Jun. 7, 2012, U.S. Appl. No. 12/360,889, 9 pages.
Office Action dated May 10, 2012; for U.S. Appl. No. 12/328,798; 17 pages.
Office Action dated May 24, 2010, U.S. Appl. No. 12/328,798, 22 pages.
Office Action dated Nov. 26, 2007; for U.S. Appl. No. 11/383,021; 19 pages.
Office Action dated Oct. 31, 2011, U.S. Appl. No. 12/328,798; 23 pages.
Response to EP Official Communication; dated Nov. 26, 2008; for EP Patent App. No. 06 770 974.1; 44 pages.
Response to Office Action filed May 17, 2012, U.S. Appl. No. 12/360,889, 15 pages.
Response to Japanese Office Action for Japanese Application No. 2006-524610 dated Sep. 4, 2008 (PCT/US2004/009908), including English translation of Amended Claims, 10 pages.
Response to Office Action (with Claims in English) filed Oct. 15, 2013; for Japanese Pat. App. No. 2011-539582; 13 pages.
Response to Office Action dated Nov. 26, 2007; and filed on Feb. 26, 2008; for U.S. Appl. No. 11/383,021; 14 pages.
Response to Office Action filed Feb. 28, 2012, U.S. Appl. No. 12/328,798, 15 pages.
Response to Office Action filed Oct. 21, 2011, U.S. Appl. No. 12/360,889, 10 pages.
Response to Office Action filed Oct. 9, 2012, U.S. Appl. No. 12/328/798; 6 pages.
Response to Office Action filed on Jul. 21, 2010, U.S. Appl. No. 12/328,798, 23 pages.
Response to Office Action filed on May 3, 2012, U.S. Appl. No. 13/241,380, 16 pages.
Response to Office Action filed Sep. 27, 2012, U.S. Appl. No. 12/360,889, 12 pages.
Response to Office Action filed Apr. 15, 2013 for U.S. Appl. No. 12/360,889; 7 pages.
Schneider et al.; "Integrated Flux Concentrator Improves CMOS Magnetotransistors;" Proceedings of the Workshop on Micro Electrical Mechanical Systems; Amsterdam, NL; Jan. 29, 1995; XP000555259; 6 pages.
Second and Supplementary Notice Informing the Applicant of the Communication of the International Application (To Designated Offices Which Apply the 30 Month Time Limit Under Article 22(1)), PCT/US2007/008920, dated Aug. 14, 2008, 1 page.
Notification of Transmittal of the International Preliminary Report on Patentability, PCT/US2012/068912, dated Apr. 8, 2014, 10 pages.
U.S. Appl. No. 12/112,192 Notice of Allowance dated Mar. 31, 2014, 24 pages.
Response to Written Opinion in International Patent Application No. PCT/US2012/068912 filed on Mar. 3, 2014, 9 pages.
Office Action dated Oct. 6, 2014; for U.S. Appl. No. 13/838,864; 26 pages.
Office Action dated Oct. 2, 2014; for U.S. Appl. No. 13/838,131; 29 pages.
Japanese Patent Application No. 2013-107637 Response to Office Action filed on Sep. 29, 2014, including foreign associate cover letter and translation of claims, 15 pages.
Singapore Patent Application No. 2013059860 Search and Examination Report dated Oct. 8, 2014, English translation only, 15 pages.
European Patent Application No. EP12809921.5 Response filed on Jan. 13, 2015 18 pages.
Final Office Action dated Mar. 24, 2015; for U.S. Appl. No. 13/838,864; 25 pages.
Final Office Action dated Apr. 2, 2015; for U.S. Appl. No. 13/838,131; 25 pages.
Notification of Transmittal of the International Preliminary Report on Patentability, PCT/US2012/068912, dated Apr. 8, 2014, 9 pages.
U.S. Appl. No. 14/090,037 Restriction Requirement dated Jul. 15, 2014, 7 pages.
U.S. Appl. No. 14/090,037 Response to Restriction Requirement filed Jul. 29, 2014, 1 page.
U.S. Appl. No. 14/090,037 Office Action dated Aug. 14, 2014, 36 pages.
U.S. Appl. No. 14/090,037 Response to Office Action filed Dec. 18, 2014, including Terminal Disclaimer, 11 pages.
U.S. Appl. No. 14/090,037 Final Office Action dated Feb. 24, 2015, 13 pages.
U.S. Appl. No. 14/090,037 RCE and Response to Office Action filed May 26, 2015, 13 pages.
U.S. Appl. No. 14/090,037 Office Action dated Jun. 4, 2015, 8 pages.
U.S. Appl. No. 14/090,037 Response to Office Action filed Sep. 3, 2015, 13 pages.
U.S. Appl. No. 14/090,037 Notice of Allowance dated Nov. 20, 2015, 7 pages.
U.S. Appl. No. 13/350,970 Restriction Requirement dated Mar. 19, 2013, 8 pages.
U.S. Appl. No. 13/350,970 Response to Restriction Requirement filed Apr. 19, 2013, 1 page.
U.S. Appl. No. 13/350,970 Office Action dated May 31, 2013, 5 pages.
U.S. Appl. No. 13/350,970 Response to Office Action filed Jun. 20, 2013, 7 pages.
U.S. Appl. No. 13/350,970 Notice of Allowance dated Sep. 3, 2013, 10 pages.
U.S. Non-Final Office Action dated Oct. 19, 2016 for U.S. Appl. No. 15/049,732; 30 Pages.
Response to U.S. Non-Final Office Action dated Oct. 19, 2016 (with Terminal Disclosure) for U.S. Appl. No. 15/049,732; Response filed on Nov. 8, 2016; 8 Pages.
Notice of Allowance dated Dec. 2, 2016 for U.S. Appl. No. 15/049,732; 16 Pages.
European Examination Report dated Dec. 11, 2017 corresponding to European Appl. No. 12809921.5; 7 Pages.
Final Office Action dated Oct. 20, 2017 for U.S. Appl. No. 13/838,131; 17 pages.
European Intention to Grant (with Allowed Specification) dated Jan. 9, 2019 for European Application No. 12809921.5; 33 Pages.

\* cited by examiner

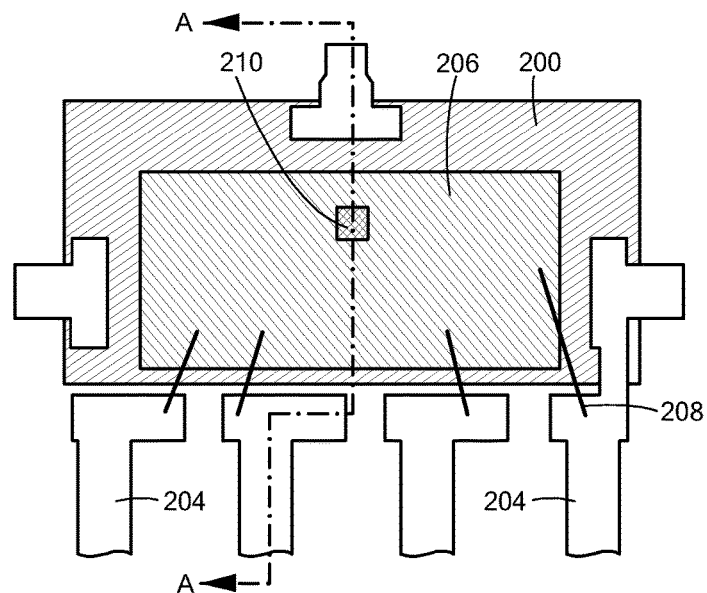
*FIG. 8*
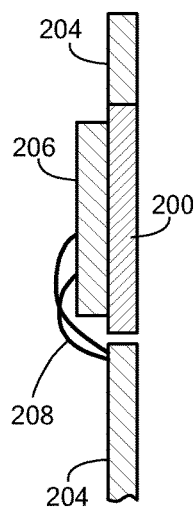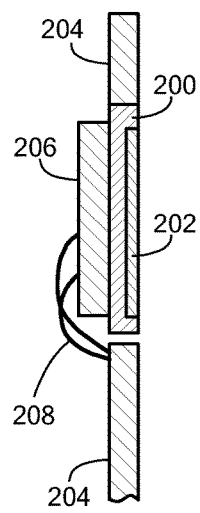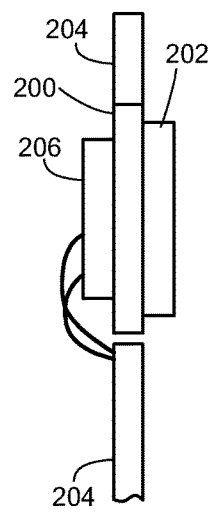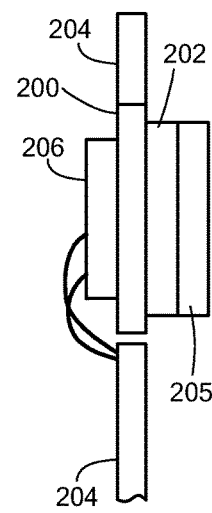
*FIG. 8A*   *FIG. 8B*   *FIG. 8C*   *FIG. 8D*

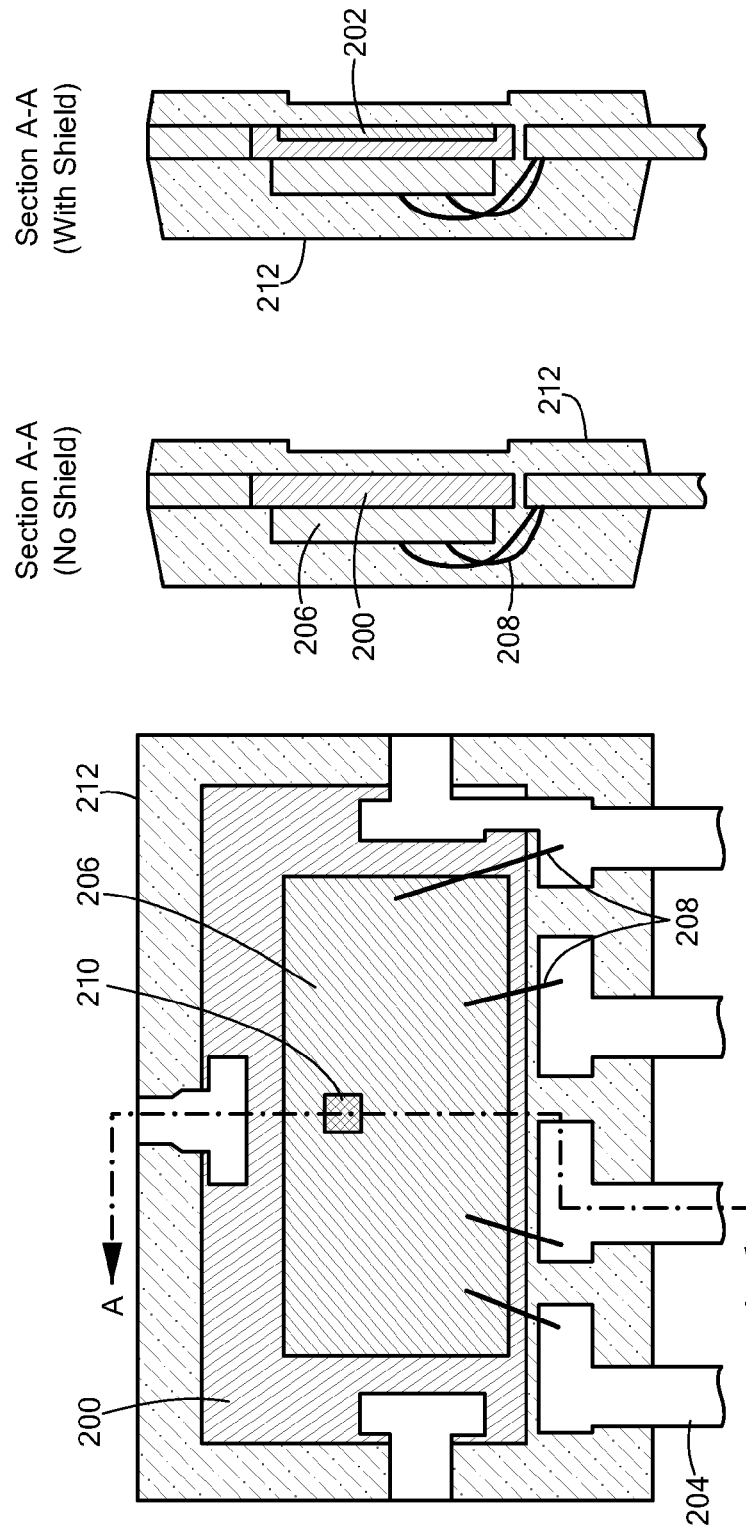

METHODS FOR MAGNETIC SENSOR HAVING NON-CONDUCTIVE DIE PADDLE

CROSS REFERENCE TO RELATED APPLICATIONS

This application is continuation of U.S. patent application Ser. No. 15/049,732, filed on Feb. 22, 2016, which is a divisional application of U.S. patent application Ser. No. 14/090,037 filed on Nov. 26, 2013, now U.S. Pat. No. 9,299,915 entitled: METHODS AND APPARATUS FOR MAGNETIC SENSOR HAVING NON-CONDUCTIVE DIE PADDLE, which is a continuation of U.S. patent application Ser. No. 13/350,970 filed on Jan. 16, 2012, now U.S. Pat. No. 8,629,539 entitled: METHODS AND APPARATUS FOR MAGNETIC SENSOR HAVING NON-CONDUCTIVE DIE PADDLE, which is incorporated herein by reference in its entirety.

BACKGROUND

As is known in the art, eddy currents can degrade the performance of integrated circuits having magnetic sensors. Magnetic sensors typically include a magnetic transducer, such as a Hall cell element, on the surface of an integrated circuit, which is mounted on a metal leadframe. The sensor is connected to the leadframe with wires and overmolded with thermoset plastic. While such magnetic sensors may be suitable for sensing static magnetic fields, at higher frequencies increasing eddy currents are generated in the conductive leadframe in response to the changing magnetic field. Eddy currents flow in circular loops perpendicular to the direction of the magnetic flux vectors. The eddy currents create an opposing magnetic field underneath the Hall cell, which can cause unacceptably large errors in the magnetic field strength detected by the sensor.

While prior art attempts have been made to provide slots in conductive leadframes to reduce eddy current flow, such slots provide only limited reductions in eddy current levels. U.S. Pat. No. 6,853,178 to Hayat-Dawoodi, for example, shows various slots across the leadframe and crossed slots.

SUMMARY

In one aspect of the invention, a method comprises: employing a conductive leadframe; forming a non-conductive die paddle in relation to the leadframe; placing a die on the non-conductive die paddle to form an assembly; forming at least one electrical connection between the die and the leadframe; and overmolding the assembly to form an integrated circuit package.

The method can further include one or more of the following features: providing a non-conductive die paddle on which the die is disposed, the non-conductive die paddle comprises a plastic material, a magnetic layer aligned with the die to affect magnetic fields proximate the die, a back-bias magnet as part of the IC package, the conductive leadfinger material is at least a given distance more than a height from the leadfingers to the magnetic sensing element, the conductive leadfinger material is at least two times a vertical height from the leadfingers to the magnetic sensing element, the magnetic sensor element is formed in the die, the magnetic sensor element includes a Hall element, the magnetic sensor element includes a magnetoresitive element, the leadfinger material extends from only one side of the magnetic field sensor device, and/or applying an underfill material proximate the wafer bumps.

BRIEF DESCRIPTION OF THE DRAWINGS

The foregoing features of this invention, as well as the invention itself, may be more fully understood from the following description of the drawings in which:

FIG. 7A is a side sectional view of the IC package of FIG. 7 without a magnetic layer;

FIG. 7B is a side sectional view of the IC package of FIG. 7 with a magnetic layer;

FIG. 8 is a schematic representation of a partially fabricated IC package in accordance with exemplary embodiments of the invention;

FIG. 8A is side sectional view of the assembly of the IC package of FIG. 8 without a magnetic layer;

FIG. 8B is side sectional view of the assembly of the IC package of FIG. 8 with a magnetic layer;

FIG. 8C is a side view of an assembly with a magnetic layer secured to a back of the non-conductive die paddle;

FIG. 8D is a side view of an assembly with a hard ferromagnetic material layer secured to the magnetic layer of FIG. 9C;

FIG. 9 is a schematic representation of an IC package in accordance with exemplary embodiments of the invention;

FIG. 9A is side sectional view of the assembly of the IC package of FIG. 9 without a magnetic layer;

FIG. 9B is side sectional view of the assembly of the IC package of FIG. 9 with a magnetic layer;

DETAILED DESCRIPTION

The present invention provides methods and apparatus for an integrated circuit (IC) package including a die on a non-conductive die paddle to reduce eddy current effects on a magnetic sensor. In one embodiment, a Single In-line Package (SIP) with a non-conductive or high resistivity plastic die paddle allows design flexibility and improved magnetic sensor performance when encapsulating magnetic semiconductor Integrated Circuits (ICs). The non-conductive or high resistivity is large enough such that an eddy current that results in an unacceptably large magnetic field error is not induced in the application. The non-conductive die paddle improves the response time and bandwidth of magnetic sensors for high frequency applications, such as DC-DC converters and inverters in switch mode power supplies. In an exemplary embodiment, a layer of ferromagnetic or magnet material is placed inside the package. The ferromagnetic or magnetic material may be either a soft ferromagnetic or a hard ferromagnetic material, or in some cases both a soft and hard ferromagnetic material layer and multilayer. It is understood that the term "die paddle" refers to the area of the leadframe or package that a die or multiple die may locate in the final package construction.

Before describing exemplary embodiments of the invention, some information is provided. Magnetic sensor integrated circuits, which contain transducers, including but not limited to, Hall Effect, MR (magnetoresistive), GMR (giant magnetoresistive, AMR (anisotrpic magnetoresistive) and TMR (tunneling magnetoresistive) type devices have inherent bandwidth limitations due to the physical and electrical design of the Integrated Circuit (IC). Magnetic sensor circuits have inherent capacitance, inductance, and resistance that form some type of tuned circuit determining the overall frequency response/bandwidth of the transducer circuit on the magnetic IC. This bandwidth is typically relatively high, e.g., from about 50 Hz to hundreds of kHz for sensor output. This bandwidth is often filtered on the IC in amplification and filtering stages to optimize device performance and lower output noise. It is understood that filtering can be minimized, usually at the expense of accuracy. With a high bandwidth design, the physical packaging should be considered because it will limit the response time for high frequency magnetic events, as discussed below.

Figure 1:
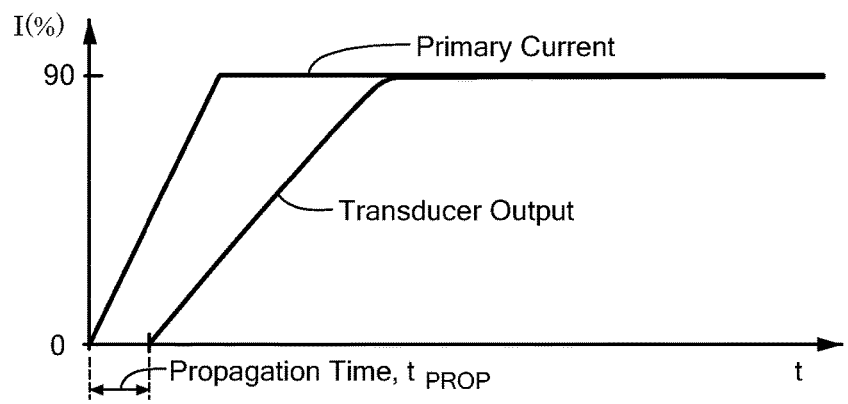
FIG. 1 is a graphical representation of propagation time for a prior art magnetic integrated circuit.

FIG. 1 shows the propagation delay ($t_{PROP}$) of a conventional magnetic integrated circuit. The propagation delay is the time required for the magnetic sensor output to reflect a change in the applied magnetic field. Propagation delay is attributed to magnetic transducer signal conditioning in the IC and to inductive loading within the linear IC magnetic sensor package, as well as the inductive loop formed by the primary conductor geometry creating the magnetic field.

Figure 2:
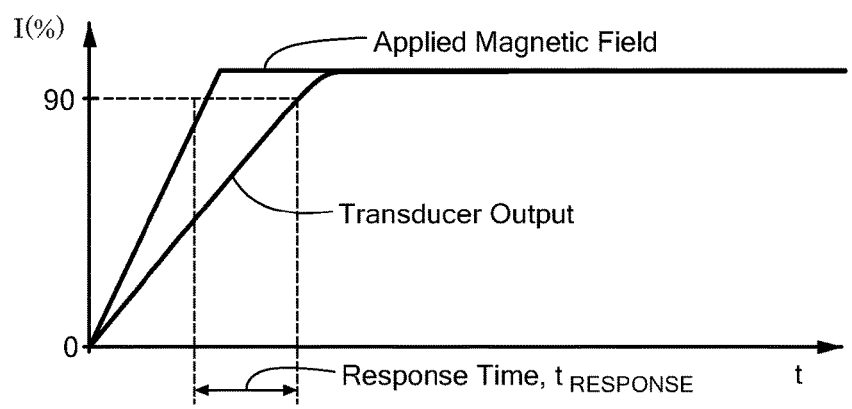
FIG. 2 is a graphical representation of response time for a prior art magnetic integrated circuit.

FIG. 2 shows the device response time ($t_{RESPONSE}$), which is defined as the time interval between when the applied magnetic field reaches 90% of its final value and when the magnetic sensor IC output reaches 90% of its output value corresponding to the applied magnetic field.

Figure 3:
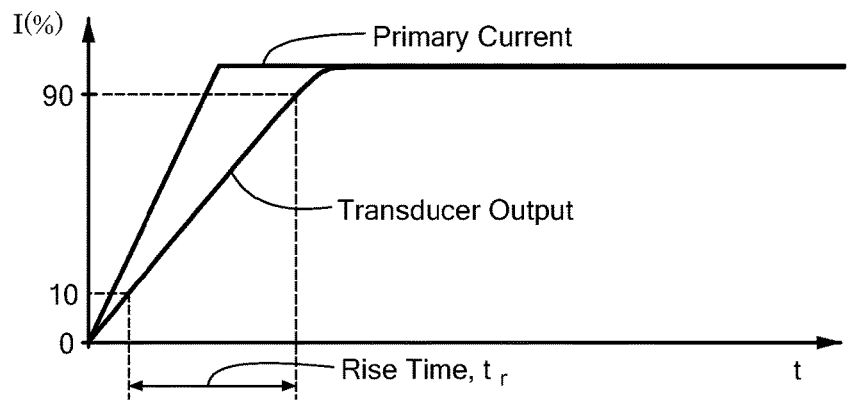
FIG. 3 is a graphical representation of rise time for a prior art magnetic integrated circuit.

FIG. 3 shows the device rise time ($t_r$), which is the time interval between the magnetic sensor output reaching 10% of its full scale value and reaching 90% of its full scale value. The rise time to a step response is used to derive the approximate bandwidth of the magnetic sensor, and is calculated as $f(-3\ dB)=0.35/t_r$. It should be noted that the rise time $t_r$ and response time $t_{RESPONSE}$ are detrimentally affected by eddy current losses observed in the conductive IC die paddle, which is often also the ground plane. Therefore, the bandwidth and overall response time for a high frequency magnetic sensor is determined by the IC design, as well as the packaging.

Figure 4:
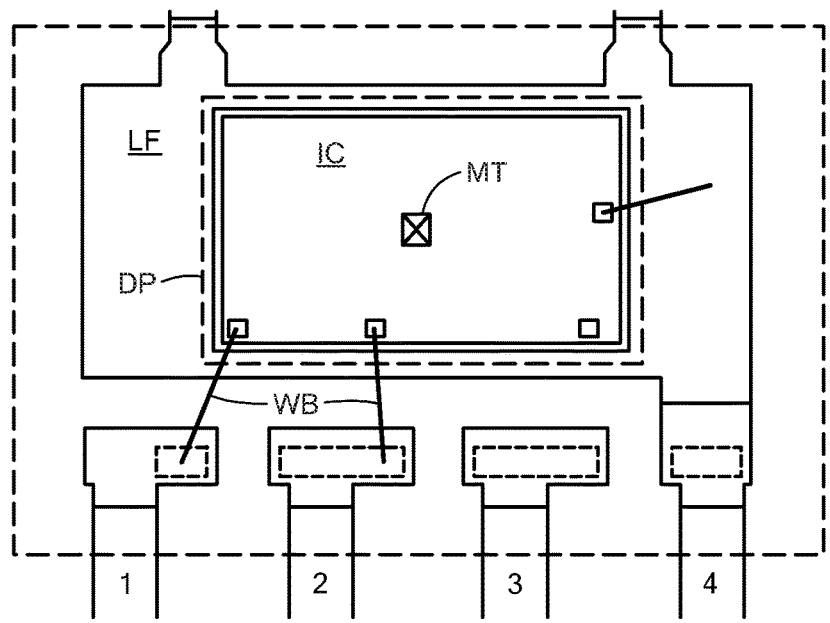
FIG. 4 is a prior art magnetic sensor IC package.

In a conventional SIP configuration shown in FIG. 4, the die IC is mounted on the die paddle DP of the leadframe LF, which is often connected to the GND lead of the package, shown as pin 4. The die IC is attached to the leadframe die paddle DP with a conductive adhesive and contact from the die active areas to the leads is made with a gold wire bond WB. The assembly is then over-molded, for example with a mold compound, to protect the die IC and wire bonds WB. Typically, many devices are over-molded at the same time and singulated from the matrix leadframe after molding into individual units.

In conventional ICs, the leadframe material, e.g., plated copper, is conductive. The conductive leadframe LF allows eddy currents to form during high frequency magnetic events. As is known in the art, eddy currents are currents induced in conductors that oppose the change in magnetic flux that generated the eddy currents. Eddy currents are generated when a conductor is exposed to a changing magnetic field due to relative motion of the field source and conductor and/or field variations over time. The resultant eddy currents create induced magnetic fields that oppose the change of the original magnetic field change in accordance with Lenz's Law. The opposing field delays the response time of the magnetic sensor IC to reach the value of the measured magnetic field. As seen in FIG. 4, the magnetic transducer element MT is subject to both the incident and opposing magnetic fields.

Figure 5:
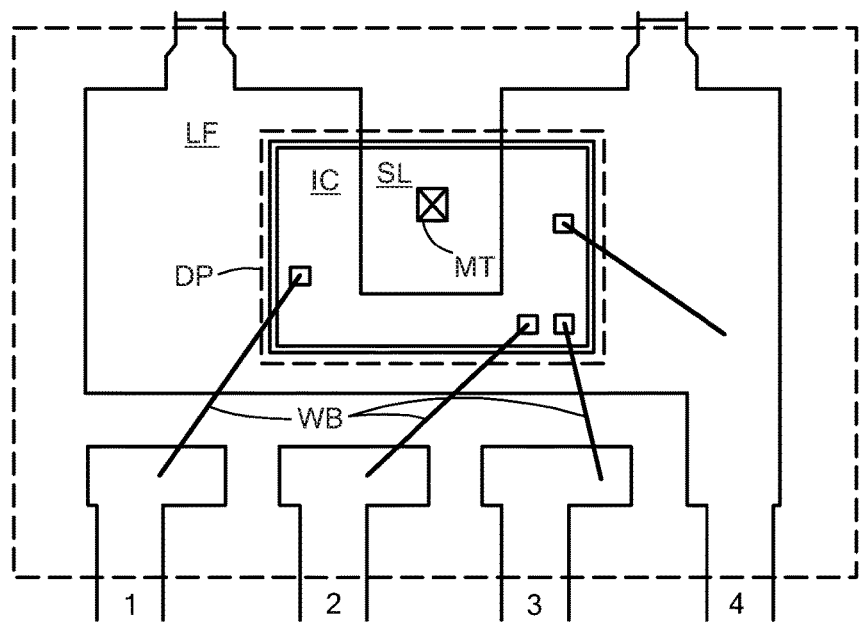
FIG. 5 is a prior art magnetic sensor IC package with a slot in a conductive leadframe.

FIG. 5 shows a prior art device having a portion of a copper leadframe behind the magnetic transducer removed to form a slot SL to reduce eddy current levels. While forming slots in a conductive leadframe may reduce eddy currents to acceptable levels, higher frequency operation may still be limited.

In one aspect of the invention, a magnetic sensor IC includes a non-conductive die paddle to minimize the amount of electrically conductive material proximate the IC in order to reduce, if not eliminate, eddy currents. The die is attached to a non-conductive material, such as plastic, for example a non-conductive mold compound, instead of copper leadframe material. With this arrangement, eddy currents near the integrated circuit are minimized, which concomitantly minimizes the strength of the opposing field generated by the eddy currents, and therefore, lowers the instantaneous error and reduces the response time.

Figure 6:
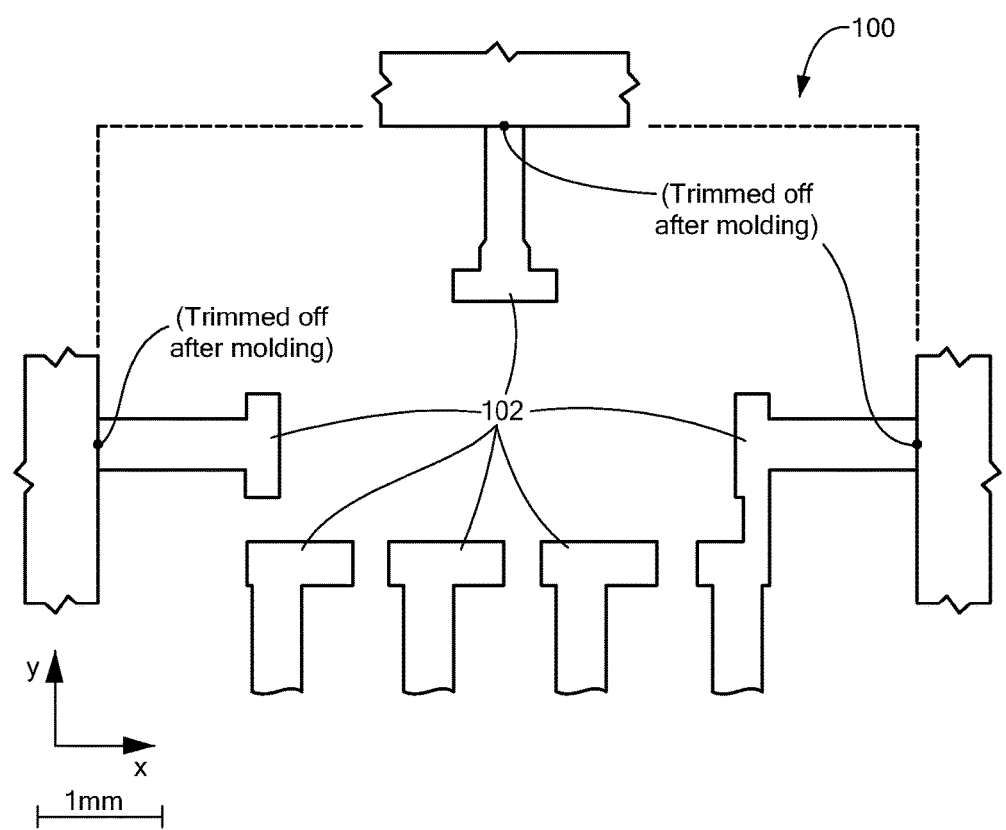
FIG. 6 is a schematic depiction of a conductive leadframe that can form a part of an IC package having a non-conductive die paddle.

FIG. 6 shows a leadframe 100 that can form the basis for an IC package with a non-conductive die paddle in accordance with exemplary embodiments of the invention. Prior to formation of the non-conductive die paddle, the leadframe 100 has only conductive portions 102. The conductive portions 102 can be formed from copper or other metal to provide lead fingers. In one embodiment, a Fe—Ni alloy, such as KOVAR (trademark of Carpenter Technology Corporation), is used. In general, the conductive leadframe material is outside a perimeter of the die. The nonconductive die paddle to eliminate conductive material, e.g., copper, behind the sensor IC for reducing eddy currents can be formed as described below.

Figure 7:
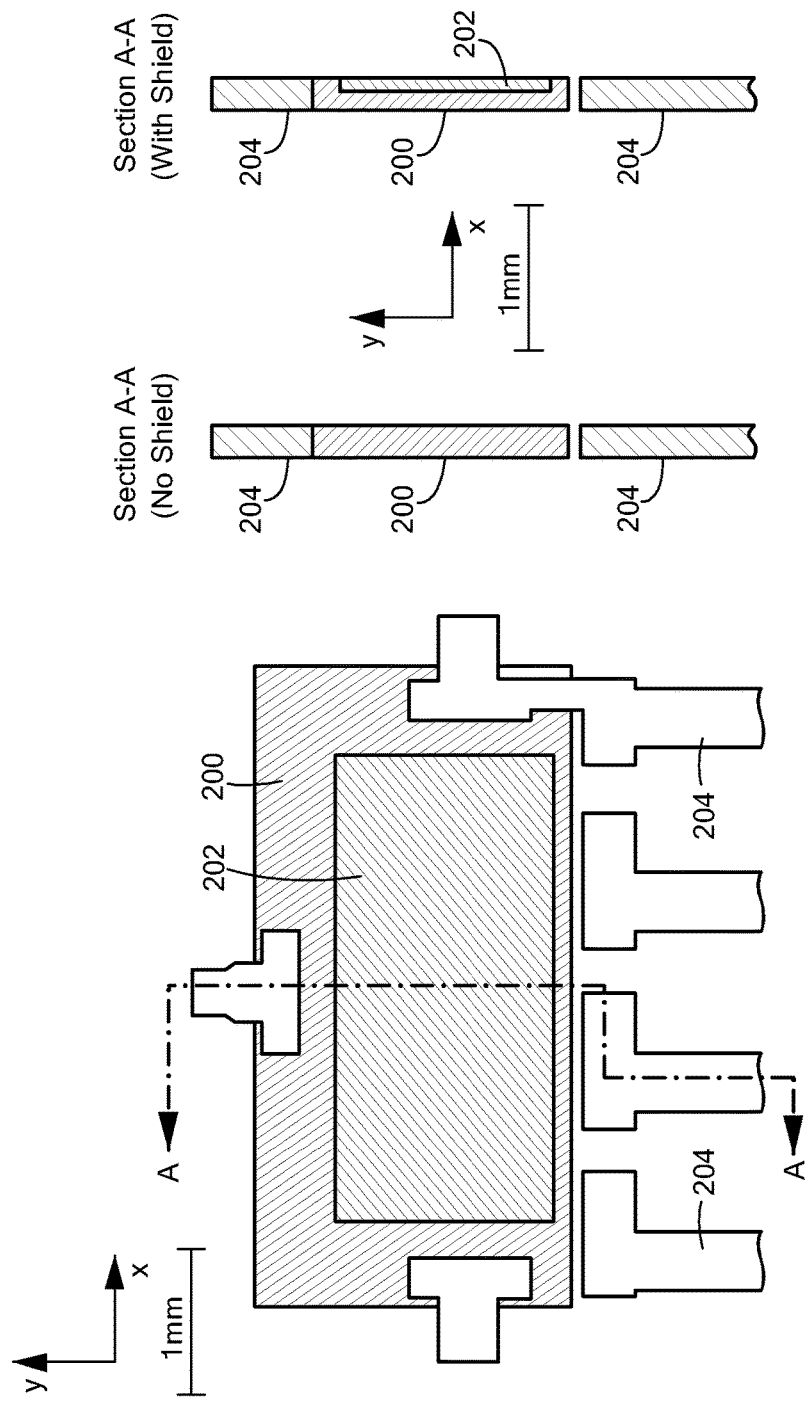
FIG. 7 is a schematic representation of partially fabricated IC package in accordance with exemplary embodiments of the invention.

FIG. 7 shows the assembly of FIG. 6 overmolded in a first mold step to create a non-conductive die paddle 200 with an optional magnetic layer 202 in relation to a conductive leadframe 204. In other embodiments, the magnetic layer 202 can be provided as a ferromagnetic material that can be used as a magnet or concentrator for magnetic fields behind a die. With a back biased ferromagnetic magnetic layer 202 in the plastic package, the bandwidth may be limited. However, in some applications a ferromagnetic material, or a back biased magnet, may be more desirable than high frequency operation. It should also be noted that the thickness of the magnetic layer is typically be less than that of the leadframe material. In the case of a back biased magnetic material the conductivity is lower, therefore resulting in lower eddy currents in the magnetic layer 202.

It is understood that the geometry and dimensions of the components in exemplary embodiments of the invention can vary to meet the needs of a particular application. For example, die paddle materials can have different lead thicknesses, which can vary depending on the package design. Exemplary thicknesses include 8 mils, 10 mils, and 15 mils. However, packages such as MLP (micro leadframe) or QFN (quad flat no leads) may use less material, e.g., 5 mils. It is contemplated that thickness will continue to decrease as technology improves, e.g., as package sizes and volumes continue to decrease.

In the illustrated embodiment, the conductive leadframe material 204 does not overlap at all with the die. That is, where the die 206 is located in a horizontal plane and the leadframe is located in the same or different horizontal plane, no vertical line intersects both the die and the leadframe. It should be noted that as long as any leadframe overlap does not come near the magnetic field transducer the spirit of the invention is maintained.

The magnetic layer 202 can be provided in a wide range of geometries, dimensions and materials, to meet the needs of a particular application. In one embodiment, the magnetic layer is provided as a back biased magnet comprising, but not limited to: NeFeB, a hard ferrite, and/or SmCo. In other applications, the magnetic layer 202 is provided as a soft magnetic material when used to direct flux and a magnet is provided as a relatively hard magnetic material that applies flux. In the case of a desire to isolate electrical influences, the magnetic layer may be a conductive layer, e.g., a ground plane.

FIG. 7A shows a side view of the assembly without a magnetic layer and FIG. 7B shows a side view of the assembly with the magnetic layer 202. It should be noted that while FIG. 7B shows the magnetic layer 204 flush with the material 200, the material 202 may extend beyond edge or be short of the edge of the material 200 for certain applications.

As shown in FIG. 8, once the first mold step to provide the non-conductive die paddle 200 is complete, with or without the magnetic layer 202, a die 206 can be mounted on the plastic die paddle 200 and wire-bonded to create connections 208 from the die to the lead fingers. A magnetic transducer 210, such as a Hall element or magnetoresistor (giant magneotresistance (GMR), anisotropic magnetoresitive element (AMR), magnetic tunnel junction (MTJ), or tunneling magnetoresistor (TMR)), can be provided in the die in a manner well known in the art. In general, there is no overlap between the die 206 and the conductive leadframe 204. It is understood that the spacing from the edge of the die to any leadframe material would be considered by the designer for a given application.

FIG. 8A shows a side view of the assembly without a magnetic layer and FIG. 8B shows a side view of the assembly with the magnetic layer 202. FIG. 8C shows a side view of an assembly with a magnetic layer 202 secured to a back of the non-conductive die paddle 200. In another embodiment shown in FIG. 8D, a hard ferromagnetic material layer 205 can provide a back-bias magnet instead of or in addition to the magnetic layer 202 provided by the soft ferromagnetic material.

As shown in FIG. 9, to complete the packaging a final overmold step with mold material 212 yields the final IC package. FIG. 9A shows a side view of the assembly without a magnetic layer and FIG. 9B shows a side view of the assembly with the magnetic layer 202. FIGS. 9A and 9B show an optional dimple or reduced thickness of the package behind the die.

Figures 10, 11:
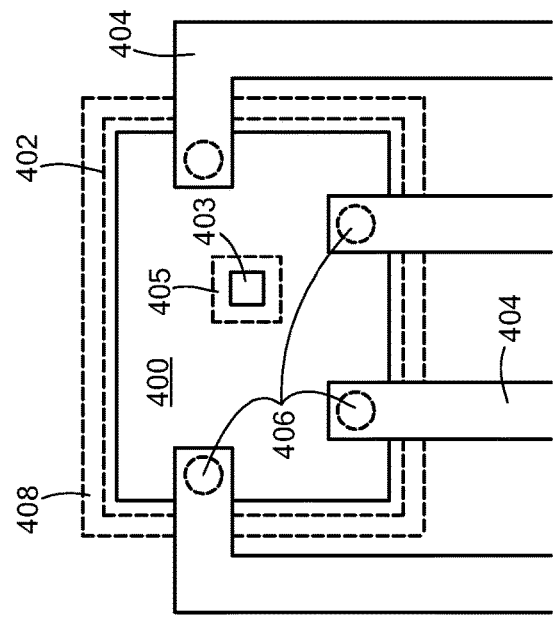
FIG. 10 is a flow diagram showing an exemplary sequence of steps for fabrication an IC package in accordance with exemplary embodiments of the invention.
FIG. 11 is a schematic representation of an exemplary flip chip embodiment of an IC package in accordance with exemplary embodiments of the invention.

FIG. 10 shows an exemplary sequence of steps for fabricating an IC having a non-conductive die paddle in accordance with exemplary embodiments of the invention. In step 300, a leadframe is formed. In one embodiment, the leadframe is fabricated from a conductive material, such as copper, and is configured to provide leadfingers for the IC package. In step 302, a die paddle is fabricated from a non-conductive material, such as an electrically insulating, or non-conductive plastic. In one embodiment, the die paddle is formed using a mold process. The die paddle is oriented with respect to the leadframe.

An optional magnetic layer can be provided in step 304. In one embodiment, a magnetic concentrator or a permanent magnet is positioned in the die paddle as part of the die paddle molding process. The magnetic material can be formed from a soft ferromagnetic material to protect the die from magnetic fields behind the IC package. In another embodiment, a hard ferromagnetic material may be utilized to provide a back-bias magnet instead of or in addition to the magnetic layer provided by the soft ferromagnetic material, as shown in FIG. 8D.

In step 306, a die is placed on the leadframe/die paddle assembly. In general, the die paddle is configured such that there is no conductive material overlapping or directly adjacent the die so as to reduce, if not eliminate, eddy currents proximate the die. In one embodiment, an adhesive, preferably, but not limited to, a non-conductive adhesive, secures the die to the die paddle. The die can include one or more magnetic transducer elements. It is understood that eddy currents in an adhesive would be lower due the reduced thickness.

In step 308, wirebonds are formed between active areas of the die and lead fingers of the leadframe to provide the desired connections. In step 310, the assembly can be overmolded to provide an IC package. Any suitable overmolding material can be used.

FIG. 11 shows an exemplary flip chip configuration for an IC package having a die 400 positioned on an optional non-conductive die paddle 402. A magnetic transducer 403, such as a Hall element or a magnetoresistive element, can be provided in the die. Conductive lead fingers 404 have a bump area 406 to provide a connection to active areas of the die 400, which may have solder balls or stud bumps (for example copper pillars). The connection of the die to the leadframe is typically achieved via a reflow step. In an alternative embodiment, an epoxy adhesive is used at designated locations. An overmold material 408 is overmolded about the assembly to provide the IC package.

It is understood that a magnetic layer may also be used in conjunction with flip-chip embodiment. It is further understood that other methods, such as chip on lead technology, can also be used without departing from the scope of the invention.

In an exemplary flip chip embodiment, the die paddle step 306 and wirebond step 308 of FIG. 10, are modified to reflow bumps onto the lead fingers and apply an optional underfill material. In one embodiment, after place and reflow of the bumped die, the assembly is overmolded in a single molding step.

In one flip chip embodiment, conductive leadframe material is kept away from the magnetic transducer, e.g., the Hall plate. A boundary region 405 can define an area that contains no conductive material. In general, the boundary region 405 should minimize eddy current influences. In one particular embodiment, conductive leadframe material is at least 0.25 mils away from a boundary of the Hall element. In another embodiment, the conductive leadframe material is at least two times the vertical height from the leadframe to the transducers. In flip chip configurations, if the after reflow bump height is 50 to 75 microns, for example, a distance of 100 to 200 um may be required. For wirebonded parts, this distance may need to be larger.

It is understood that the boundary region can comprise any suitable geometry to meet the needs of a particular application. Exemplary geometries include rectangular, circular, ovular, and other shapes that enclose an area.

Exemplary embodiments of the invention provide a magnetic sensor IC capable of increased frequency as compared to conventional sensors. Overmolding without an electrical or magnetic layer of conductive, soft ferromagnetic, or hard magnetic material in the first mold process produces a package with minimal nearby copper leadframe material to conduct eddy currents. The packaged device is physically optimized for increased frequency applications.

Using a layer of ferromagnetic material in the first overmold process lowers the bandwidth, but provides shielding from nearby interfering fields coming from the back side of the package for applications where a sensor is looking for a field coming from one side of the package. This layer, in this case a magnetic concentrator layer, also concentrates or focuses incident desired fields on the front of the package in cases where the field to be sensed is weak and allows for improved sensor performance under weak field conditions.

Using a layer of hard or permanent magnetic material allows for an integrated back biased magnetic solution to sense the motion of soft ferromagnetic material in front of the magnetic sensor IC. This back-biased magnet can be relatively thin, so that the generated field is relatively small. This configuration may be preferable for magneto-resistive solutions like GMR, AMR and TMR. This configuration can be used in IC packages for gear tooth sensors, such as ABS (anti-lock braking systems) or transmission gear tooth sensors with relatively small form factors. A thicker magnet allows for significant improvement in the generated back biased magnetic field for Hall back biased sensors which may result in increased working air gaps depending on a particular magnetic design.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A method, comprising:
employing a conductive leadframe;
forming a non-conductive die paddle in relation to the leadframe;
placing a die on the non-conductive die paddle to form an assembly;
forming at least one electrical connection between the die and the leadframe;
coupling a magnetic transducer to the die;
molding a magnetic layer within the die paddle; and
overmolding the assembly to form an integrated circuit package.

2. The method according to claim 1, further including forming the non-conductive die paddle from a plastic material.

3. The method according to claim 2, further including molding the plastic die paddle.

4. The method according to claim 3, wherein the leadframe does not overlap with the die.

5. The method according to claim 1, wherein the magnetic transducer does not overlap with any of the leadframe.

6. The method according to claim 1, further including overmolding the die paddle, the die, and the magnetic layer.

7. A method, comprising:
employing a conductive leadframe;
forming a non-conductive die paddle in relation to the leadframe;
placing a die on the non-conductive die paddle to form an assembly;
forming at least one electrical connection between the die and the leadframe;
overmolding the assembly to form an integrated circuit package;
positioning a Hall element in the die; and
molding a magnetic layer within the die paddle.

8. A method, comprising:
employing a conductive leadframe;
forming a non-conductive die paddle in relation to the leadframe;
placing a die on the non-conductive die paddle to form an assembly;
forming at least one electrical connection between the die and the leadframe;
overmolding the assembly to form an integrated circuit package;
positioning a magnetoresistive element; and
molding a magnetic layer within the die paddle.

9. A method, comprising:
employing a conductive leadframe;
forming a non-conductive die paddle in relation to the leadframe;
placing a die on the non-conductive die paddle to form an assembly;
forming at least one electrical connection between the die and the leadframe;
coupling a magnetic transducer to the die;
molding a magnetic layer within the die paddle;
overmolding the assembly to form an integrated circuit package; and
employing a non-conductive adhesive to secure the die to the die-paddle, wherein a material comprising the non-conductive die-paddle substantially eliminates eddy current flow in the die paddle.

10. The method according to claim 1, wherein a first surface of the leadframe and a first surface of the die are substantially coplanar.

11. A method, comprising:
employing a conductive leadframe;
positioning a non-conductive die paddle in relation to the leadframe;
positioning a die in relation to the die paddle;
coupling a magnetic transducer to the die, wherein a cross section of the device through the magnetic transducer consists of non-conductive materials; and
molding a magnetic layer within the die paddle.

12. A method, comprising:
employing a conductive leadframe;
positioning a non-conductive die paddle in relation to the leadframe, wherein the die paddle comprises a plastic material;
positioning a die in relation to the die paddle;
coupling a magnetic transducer to the die, wherein the magnetic transducer does not overlap with any conductive material;
forming at least one electrical connection from the die to the leadframe; and
molding a magnetic layer within the die paddle.

* * * * *

UNITED STATES PATENT AND TRADEMARK OFFICE
CERTIFICATE OF CORRECTION

PATENT NO. : 10,333,055 B2
APPLICATION NO. : 15/447320
DATED : June 25, 2019
INVENTOR(S) : Shaun Milano et al.

It is certified that error appears in the above-identified patent and that said Letters Patent is hereby corrected as shown below:

In the Specification

Column 1, Line 7, delete "is continuation" and replace with --is a continuation--.

Column 1, Line 25, delete "Hall cell element," and replace with --Hall Effect element,--.

Column 1, Line 34, delete "Hall cell," and replace with --Hall Effect element,--.

Column 2, Line 18, delete "of partially" and replace with --of a partially--.

Column 2, Line 28, delete "is side" and replace with --is a side--.

Column 2, Line 30, delete "is side" and replace with --is a side--.

Column 2, Line 36, delete "FIG. 9C;" and replace with --FIG. 8C;--.

Column 2, Line 39, delete "is side" and replace with --is a side--.

Column 2, Line 41, delete "is side" and replace with --is a side--.

Column 2, Line 44, delete "an IC" and replace with --of an IC--.

Column 3, Line 11, delete "(anisotrpic" and replace with --(anisotropic--.

Column 4, Line 53, delete "be less" and replace with --less--.

Column 5, Line 24, delete "beyond edge" and replace with --beyond the edge--.

Column 6, Line 19, delete "due the" and replace with --due to the--.

Signed and Sealed this
Tenth Day of December, 2019

Andrei Iancu
*Director of the United States Patent and Trademark Office*